US012794409B2

(12) United States Patent
Yoon et al.

(10) Patent No.: US 12,794,409 B2
(45) Date of Patent: Nov. 10, 2026

(54) SWITCHING ELEMENT OPERATION DETECTION DEVICE AND PHOTOVOLTAIC POWER CONVERSION DEVICE

(71) Applicant: LG INNOTEK CO., LTD., Seoul (KR)

(72) Inventors: Dong Keun Yoon, Seoul (KR); Ju Young Jang, Seoul (KR); Young Woo Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 69 days.

(21) Appl. No.: 18/288,619

(22) PCT Filed: Apr. 28, 2022

(86) PCT No.: PCT/KR2022/006095
§ 371 (c)(1),
(2) Date: Oct. 27, 2023

(87) PCT Pub. No.: WO2022/231341
PCT Pub. Date: Nov. 3, 2022

(65) Prior Publication Data

US 2024/0213918 A1 Jun. 27, 2024

(30) Foreign Application Priority Data

Apr. 28, 2021 (KR) ........................ 10-2021-0055152

(51) Int. Cl.
*H02S 40/32* (2014.01)
*G01R 31/327* (2006.01)
(Continued)

(52) U.S. Cl.
CPC .......... *H02S 40/32* (2014.12); *G01R 31/3277* (2013.01); *H02J 13/12* (2026.01); *H02S 50/10* (2014.12)

(58) Field of Classification Search
None
See application file for complete search history.

(56) References Cited

U.S. PATENT DOCUMENTS 5,204,633 A 4/1993 Ahladas et al.
11,070,142 B2 * 7/2021 Ichiki .................... H02M 3/155
(Continued)

FOREIGN PATENT DOCUMENTS

CN 102540070 7/2012
JP 2009-260831 11/2009
(Continued)

OTHER PUBLICATIONS

International Search Report dated Aug. 12, 2022 issued in Application No. PCT/KR2022/006095.
(Continued)

*Primary Examiner* — Regis J Betsch
*Assistant Examiner* — Joel Barnett
(74) *Attorney, Agent, or Firm* — KED & ASSOCIATES, LLP

(57) ABSTRACT

A switching element operation detection device according to an embodiment of the present invention comprises: a first sensing unit for sensing current flowing through a driving circuit for driving a first switching element; a second sensing unit for sensing current flowing through a driving circuit for driving a second switching element; a first amplification unit for amplifying current sensed by the first sensing unit; a second amplification unit for amplifying current sensed by the second sensing unit; a first hysteresis unit for outputting a high signal or a low signal according to an output of the
(Continued)

first amplifier; a second hysteresis unit for outputting a high signal or a low signal according to an output of the second amplifier; and a switching element operation detection signal output unit for outputting a switching element operation detection signal when both an output of the first hysteresis unit and an output of the second hysteresis unit are high signals.

19 Claims, 7 Drawing Sheets

(51) Int. Cl.
*H02J 13/12* (2026.01)
*H02S 50/10* (2014.01)

(56) References Cited

U.S. PATENT DOCUMENTS

2005/0135031 A1 6/2005 Colby et al.
2007/0177325 A1* 8/2007 Zandonella Balco . H02H 3/335 361/118
2015/0373805 A1* 12/2015 Lian ........................ H05B 45/56 315/309
2019/0103863 A1* 4/2019 Inada ........................ H02M 1/32
2019/0350073 A1 11/2019 Papenfuss et al.
2022/0146577 A1* 5/2022 Koga .................. G01R 31/3277

FOREIGN PATENT DOCUMENTS

JP 2013-172616 9/2013
KR 10-2008-0062409 7/2008
KR 10-2010-0015157 2/2010
KR 10-1059355 8/2011
KR 10-2013-0111048 10/2013
KR 10-1410508 6/2014
KR 10-2019-0090644 8/2019
KR 10-2021-0041282 4/2021

OTHER PUBLICATIONS

Korean Office Action dated Apr. 22, 2024, issued in Application No. 10-2021-0055152.
Korean Office Action dated Aug. 21, 2025 issued in Application No. 10-2021-0055152.
Korean Office Action dated Apr. 29, 2026 issued in Application No. 10-2021-0055152.

* cited by examiner

SWITCHING ELEMENT OPERATION DETECTION DEVICE AND PHOTOVOLTAIC POWER CONVERSION DEVICE

CROSS-REFERENCE TO RELATED PATENT APPLICATIONS

This application is a U.S. National Stage Application under 35 U.S.C. § 371 of PCT Application No. PCT/KR2022/006095, filed Apr. 28, 2022, which claims priority to Korean Patent Application No. 10-2021-0055152, filed Apr. 28, 2021, whose entire disclosures are hereby incorporated by reference.

TECHNICAL FIELD

The present invention relates to a switching element operation detection device and photovoltaic power conversion device, and more specifically, to a switching element operation detection device and a photovoltaic power conversion device for detecting the operation time point of the switching element by detecting the current flowing in the driving circuit of the switching element.

BACKGROUND ART

Photovoltaic power generation is an eco-friendly energy generation method that is widely used as a replacement for existing chemical or nuclear power generation. Photovoltaic power generation is divided into an independent type where a battery is connected to a converter and a linked type where a battery is connected to the power system. In general, stand-alone power generation is configured with solar cells, storage batteries, power conversion devices, and the like, and a power grid-connected system is configured to be connected to a commercial power source to exchange powers with the load grid line.

The power generated by photovoltaic (PV) power generation is transmitted to the power system through an inverter. At this time, in order to transmit stable power to the grid, a relay is applied to connect or disconnect the inverter and the grid. As shown in FIG. 1, the inverter 11 converts the power to match the voltage of the grid being outputted from the solar panel, and the power is transmitted to the grid 12 through the filter 18. At this time, two relays 13 and 14 connected in series are formed in the transmission line to connect or disconnect from the grid 12. The relay controls the flow of current in the coil by the relay power source 15 according to the relay ON/OFF signal, and the physical switch is opened and closed by the magnetic force generated from the coil to connect or disconnect the inverter and the grid.

In order for the inverter 11 and the grid 12 to be connected and transmit power to the grid, the controller must control the inverter 11 to perform current control, but because the controller does not know the time point exactly when the switches of contact point A of all relays 13 and 14 turn on (close), there is a problem that the inverter 11 cannot be controlled immediately at the corresponding time point. Here, contact point A refers to a contact point being connected when the switch being formed on the wire connecting the inverter 11 and the grid 12 is turned off. When attempting grid connection with the output voltage of the inverter 11 being synchronized with the grid voltage, even if the switches of contact point A of the relay 13 and 14 is changed from open to closed, since there is almost no change in the inverter output voltage and current, it cannot be confirmed whether the contact point A of all relays 13 and 14 is closed. In other words, it is impossible to check whether normal power is applied to the coil in the relay driving circuit and whether the coil current that can normally turn on the relay is flowing. Since the delay time between relays varies, there is a problem in that it is impossible to accurately estimate when the switches of contact point A of all relays 13 and 14 are closed.

DETAILED DESCRIPTION OF THE INVENTION

[Technical Subject]

The technical problem to be solved by the present invention is to provide a switching element operation detection device and a photovoltaic power generation power conversion device that detects the operation time point of the switching element by detecting the current flowing in the driving circuit of the switching element.

Technical Solution

In order to solve the above technical problem, a switching element operation detection device according to an embodiment of the present invention comprises: a first sensing unit that senses a current flowing in a driving circuit that drives the first switching element; a second sensing unit that senses the current flowing in the driving circuit that drives the second switching element; a first amplification unit that amplifies the current sensed by the first sensing unit; a second amplification unit that amplifies the current sensed by the second sensing unit; a first hysteresis unit that outputs a high signal or a low signal according to the output of the first amplification unit; a second hysteresis unit that outputs a high signal or a low signal according to the output of the second amplification unit; and a switching element operation detection signal output unit that outputs switching element operation detection signal when both the outputs of the first hysteresis unit and the output of the second hysteresis unit are high signals.

In addition, the first switching element and the second switching element may be connected in series.

In addition, the first switching element and the second switching element may be disposed between a photovoltaic power generation inverter and a grid.

In addition, the switching element operation detection signal output unit can apply the switching element operation detection signal to a controller that controls the photovoltaic power generation inverter using the switching element operation detection signal.

In addition, the first switching element and the second switching element may be relays being connected in series.

In addition, the driving circuit for driving the first switching element includes a first switch that is turned on and off according to a first switching element control signal, and the first sensing unit may sense the current flowing in the driving circuit that drives the first switching element when the first switch is turned on.

In addition, it may include: a first voltage divider that divides the output of the first amplification unit into voltages and inputs them to the first hysteresis unit; and a second voltage divider that divides the output of the second amplification unit into voltages and inputs them to the second hysteresis unit.

In addition, the first sensing unit includes a first sensing resistor, and the first amplification unit may be a differential amplifier that receives and amplifies the voltage between both ends of the first sensing resistor.

In addition, the first hysteresis unit outputs a high signal if the input voltage is above a first value when the output signal is a low signal, and may output a low signal if an input voltage is equal to or less than a second value when an output signal is a high signal.

In addition, the first value may be greater than a second value.

In addition, the switching element operation detection signal output unit includes: a third switch that operates according to the output signal of the first hysteresis unit; and a fourth switch being connected in series with the third switch and operating according to the output signal of the second hysteresis unit, and may output the switching element operation detection signal when the third switch and the fourth switch are turned on.

In order to solve the above technical problem, the switching element operation detection device according to another embodiment of the present invention comprises: a sensing unit that senses the current flowing in the driving circuit that drives the switching element; an amplification unit that amplifies the current sensed by the sensing unit; a hysteresis unit that outputs a high or low signal according to the output of the amplification unit; and a switching element operation detection signal output unit that outputs switching element operation detection signal using the output signal of the hysteresis unit.

In addition, the switching element includes a plurality of switching elements, wherein a plurality of sensing units, a plurality of amplification units, and a plurality of hysteresis units are included corresponding to the number of the plurality of switching elements, and wherein one sensing unit, one amplification unit, and one hysteresis unit are sequentially connected to each of the plurality of switching elements; and the switching element operation detection signal output unit receives output signals from the plurality of hysteresis units, and may output the switching operation detection signal when the output signals of the plurality of hysteresis units are all high.

In addition, the hysteresis unit outputs a high signal when the output signal is a low signal and the input voltage is above a first value, and may output a low signal when the output signal is a high signal and the input voltage is equal to or less than a second value.

In order to solve the above technical problem, the photovoltaic power generation power conversion device according to an embodiment of the present invention comprises: an inverter that converts the power being generated in a photovoltaic power generation panel and transmits it to a grid; a controller that controls the inverter; a plurality of switching elements being connected in series between the inverter and the grid; and a switching element operation time point detection unit that detects the operation time point of all of the plurality of switching elements, wherein the switching element operation time point detection unit comprises: a sensing unit that senses current flowing in a driving circuit that drives the plurality of switching elements; an amplification unit that amplifies the current sensed by the sensing unit; a hysteresis unit that outputs a high or low signal according to the output of the amplification unit; and a switching element operation detection signal output unit that applies a switching element operation detection signal to the controller at the time point when all output signals of the hysteresis unit corresponding to each of the plurality of switching elements become high signals, and wherein the controller controls the inverter according to the application time point of the switching element operation detection signal.

Advantageous Effects

According to embodiments of the present invention, when attempting grid connection with the inverter's output voltage synchronized with the grid voltage, since the control sequence can be changed at a time point when the contact point A of all switching elements is closed, a reliable control change sequence can be configured. In addition, in order to maintain the closed state of contact point A of switching element, since it is possible to monitor in real time whether the current flowing in the driving circuit is always maintained higher than the holding current level, protection against abnormal operation of the switching element is possible.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of a and b and c", it may include one or more of all combinations that can be combined with a, b, and c.

In addition, in describing the components of the embodiment of the present invention, terms such as first, second, a, b, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
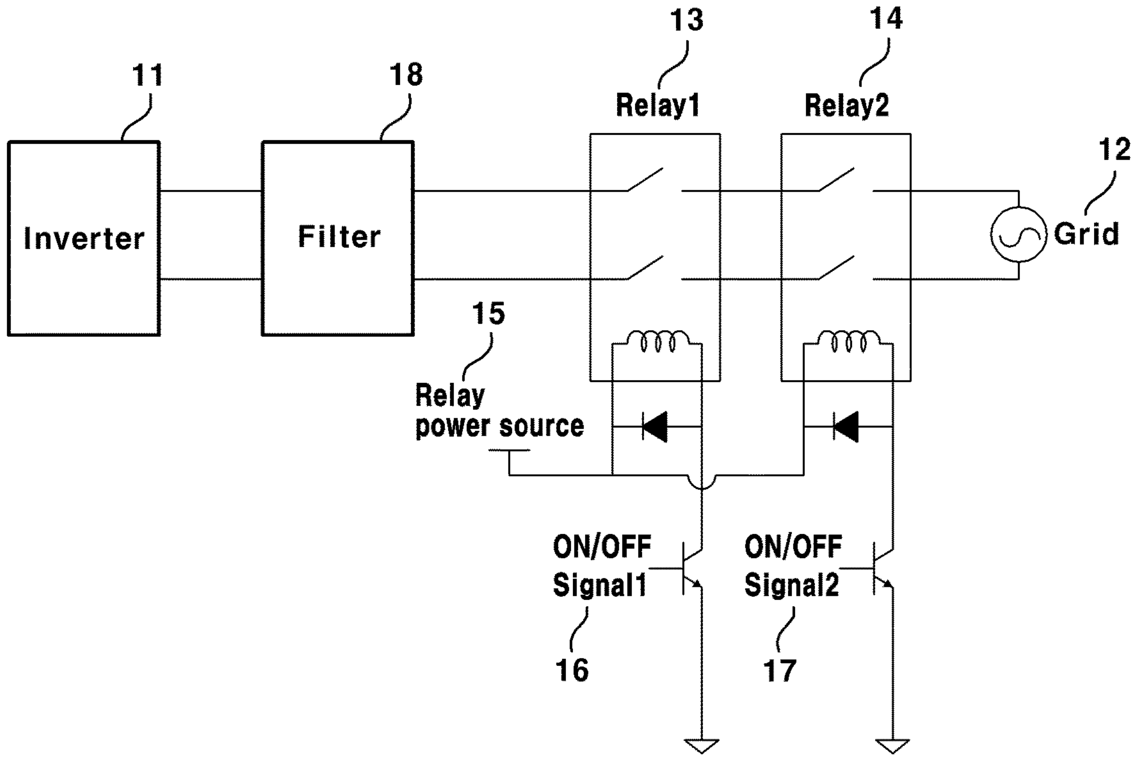
FIG. 1 shows a switching element and driving circuit according to a comparative embodiment of the present invention.
Figure 2:
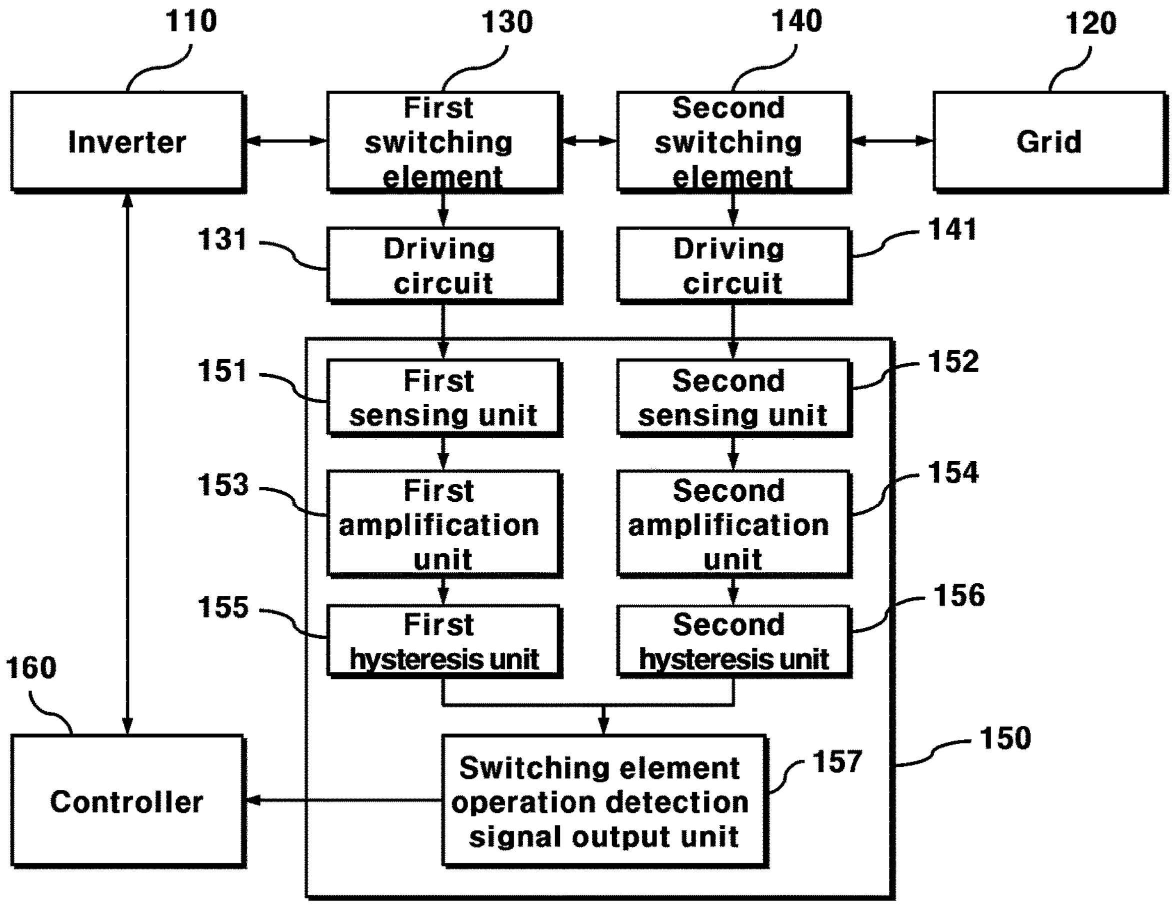
FIG. 2 is a block diagram of a switching element operation detection device according to an embodiment of the present invention.

FIG. 2 is a block diagram of a switching element operation detection device according to an embodiment of the present invention.

A switching element operation detection device 150 according to an embodiment of the present invention comprises a first sensing unit 151, a second sensing unit 152, a first amplification unit 153, a second amplification unit 154, a first hysteresis unit 155, a second hysteresis unit 156, and a switching element operation detection signal output unit 157. The first sensing unit 151, the first amplification unit 153, and the first hysteresis unit 155 are connected to the driving circuit 131 of the first switching element 130, and correspondingly, the second sensing unit 152, the second amplification unit 154, and the second hysteresis unit 156 are connected to the driving circuit 141 of the second switching element 140. Detailed descriptions of each corresponding configuration correspond to each other, except where otherwise specified.

The first sensing unit 151 senses the current flowing in the driving circuit 131 that drives the first switching element 130, and the second sensing unit 152 senses the current flowing in the driving circuit 141 that drives the second switching element 140.

The first switching element 130 and the second switching element 140 may be switching elements being connected in series. The first switching element 130 and the second switching element 140 are connected in series, and are connected when both are turned on, and are disconnected when even one is turned off. The first switching element 130 and the second switching element 140 are connected in series to increase the reliability of switching operation, and this allows safe connection.

The first switching element 130 and the second switching element 140 may be switching elements being disposed between the photovoltaic power generation inverter 110 and the grid 120. The inverter 110 converts the power generated by the photovoltaic power generation panel to be suitable for transmitting it to the grid 120, which is a power system, or receives power from the grid 120 and may convert the power to be suitable for charging a battery. To this end, the inverter 110 can convert dc to ac or ac to dc. At the input terminal of the inverter 110, a photovoltaic power generation panel and a dc-dc converter that controls the maximum power point of the photovoltaic power generation panel and converts power may be connected. Or, a dc-dc converter that converts the battery to be charged using the power generated by the photovoltaic power generation panel and the battery charging voltage may be further connected. If it is difficult to charge the battery using power from photovoltaic power generation through two-way power conversion, the inverter 110 may receive and convert power from the grid 120 to charge the battery.

The inverter 110 operates according to the control of a controller 160, and the controller 160 synchronizes the output voltage of the inverter 110 with the grid voltage and then turns on the first switching element 130 and the second switching element 140 to stably connect the inverter 110 and the grid 120. Afterwards, the controller 160 causes the inverter 110 to convert the power generated through photovoltaic power generation and transmit it to the grid 120 through current control and the like.

At this time, after the inverter 110 and the grid 120 are stably connected, that is, after both the first switching element 130 and the second switching element 140 are turned on, the controller 160 must control the inverter 110. If the controller 160 does not know exactly the operation time point of the first switching element 130 and the second switching element 140, after applying the control signal to the driving circuits 131 and 141 that drive the first switching element 130 and the second switching element 140, and after a preset time determined to be sufficient for the first switching element 130 and the second switching element 140 to be turned on stably has elapsed, the inverter 110 may be controlled, but if the first switching element 130 or the second switching element 140 is not turned on or has a problem, unnecessary time lapse may occur. If it is possible to accurately detect the operation time point of the first switching element 130 and the second switching element 140, the inverter 110 and the grid 120 can be safely connected, and the inverter 110 can be controlled without unnecessary time lapse, thereby improving efficiency.

To this end, first, the current flowing in the driving circuit 131 that drives the first sensing unit 151 and the first switching element 130 is sensed. The first switching element 130 senses the current flowing in the driving circuit 131, which generates a driving signal to turn on. When connecting the inverter 110 and the grid 120, since the output voltage of the inverter 110 and the voltage of the grid 120 are synchronized, it is impossible to accurately determine whether the first switching element 130 is turned on by measuring the voltage or current applied to the first switching element 130. In the driving circuit 131 that drives the first switching element 130, no current flows when the first switching element 130 is turned off, and when turning on the first switching element 130, more than a certain amount of current flows. Using this point, it is detected whether the first switching element 130 is turned on.

The inverter 110 and the grid 120 may be connected through (+) and (−) wires, and the first switching element 130 and the second switching element 140 may be connected or disconnected through (+) and (−) wires, respectively. This is explained using two switching elements as an example, but it may further include additional switching elements such as a third switching element and a fourth switching element being connected in series. The driving circuit, sensing unit, amplification unit, and hysteresis unit can be individually connected to each switching element that needs to be determined on individual operation.

Figure 3:
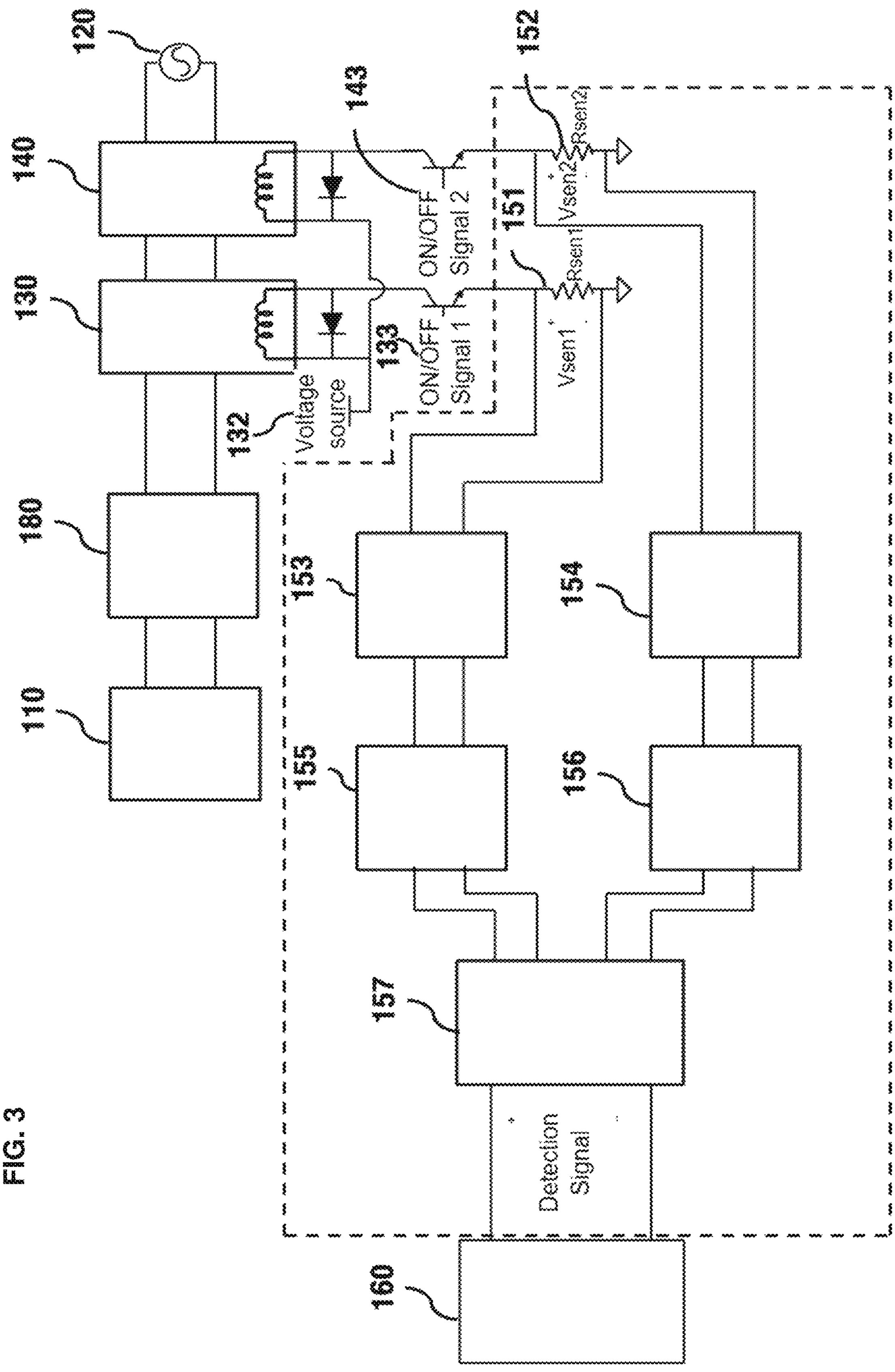
FIGS. 3 to 5 are diagrams for explaining a switching element operation detection device according to an embodiment of the present invention.

The first switching element 130 and the second switching element 140 may be relays being connected in series. As shown in FIG. 3, the driving circuit of the relay may be configured with a coil, a diode, a switch being turned on and off by a control signal (on/off signal), and a driving circuit power source (voltage source). When the first switching element 130 is turned on according to the control signal 133, current flows through the coil by the driving circuit power supply, generating magnetic force and turning on. The first sensing unit 151 can sense the current flowing in the coil to turn on the first switching element 130.

Or, the first switching element may be a variety of switching elements such as bjts and mosfets, and in the case of mosfets, a gate signal may be detected. In addition, the first switching element 130 and the second switching element 140 may be one of various elements in which switching operations occur, and the first switching element 130 and the second switching element 140 may be of the same type or different types.

The driving circuit 131 that drives the first switching element 130 includes a first switch that is turned on and off according to the first switching element control signal, and the first sensing unit 151 can sense the current flowing in the driving circuit 131 that drives the first switching element when the first switch is turned on. Here, the first sensing unit 151 may include a first sensing resistor rsen1. The first sensing resistor is connected between the first switch and the ground and senses the current flowing according to the operation of the first switch.

The driving circuit 141 that drives the second switching element 140 includes a second switch that is turned on and off according to the second switching element control signal, and the second sensing unit 152 can sense the current flowing in the driving circuit 141 that drives the second switching element when the second switch is turned on. The second sensing unit 152 may include a second sensing resistor rsen2.

The first amplification unit 153 amplifies the current sensed by the first sensing unit 151, and the second amplification unit 154 amplifies the current sensed by the second sensing unit 152. Since it is difficult to detect switching element operation using the current sensed by the first sensing unit 151 as is, it is amplified and used through the first amplification unit 153. At this time, the first amplification unit 153 can receive the current sensed by the first sensing unit 151 as a voltage and amplify it. When the first sensing unit 151 includes a first sensor resistor, the first amplification unit 153 may be a differential amplifier that receives and amplifies the voltage between both ends of the first sensing resistor. The second amplification unit 154 may be a differential amplifier that receives and amplifies the voltage between both ends of the second sensing resistor of the second sensing unit 152.

The first hysteresis unit 155 outputs a high signal or a low signal according to the output of the first amplification unit 153, and the second hysteresis unit 156 outputs a high signal or a low signal according to the output of the second amplification unit 154.

The first hysteresis unit 155 outputs a high signal when the output signal is a low signal and the input voltage is above the first value, and may output a low signal when the output signal is a high signal and the input voltage is equal to or less than the second value. Hysteresis is a hysteresis phenomenon, and means that the state is not determined only by current conditions, but it is influenced by the history of the state that has been elapsed in the past. The first hysteresis unit 155 does not determine the output signal only based on the current voltage value of the voltage of the input signal sensed by the first sensing unit 151 and amplified by the first amplification unit 153, but outputs a high signal when the output signal is a low signal and the input voltage is greater than a first value, and may output a low signal when the output signal is a high signal and the input voltage is equal to or less than a second value. Here, a first value can be set to a value greater than a second value. For example, the first value is set to 0.8 v, and the second value may be set to 0.4 v.

Using these hysteresis characteristics, it is possible to detect in real time whether the first switching element 130 is maintained on, and through this, abnormal operation of the first switching element 130 can be detected. As shown in FIG. 3, when the first switching element is a relay, the current that must flow through the coil to turn on the first switching element 130 when it is turned off must be greater than the turn-on current. After the first switching element 130 is turned on, in order to turn it off, the current flowing through the coil must be cut-off, and at this time, the current flowing through the coil must be equal to or less than the turn-off current at the time point when turning off. At this time, when the turn-on current is higher than the turn-off current, and once turned on, the on state is maintained if the current in the coil is higher than the turn-off current. Therefore, the turn-off current can be called a holding current. A first value set in the first hysteresis unit 155 may be set to a value corresponding to the turn-on current of the coil, and a second value may be set to a value corresponding to the turn-off current. For example, when a first value corresponding to the turn-on current at which the first switching element 130 is turned on is 0.8 v, and a second value corresponding to the turn-off current is 0.4 v, the initial state is a state in which the first switching element 130 is turned off, when the voltage of the signal being applied to the first hysteresis unit 155 is 0.8 v or more, the first hysteresis unit 155 outputs a high signal, and if the voltage of the applied signal is greater than 0.4 v, high signal output can be maintained. Afterwards, when the voltage of the signal applied to the first hysteresis unit becomes 0.4 v or less due to abnormal operation or the turn-off of the first switching element 130, the output signal changes from a high signal to a low signal.

It may include a first voltage dividing unit (not shown) between the first amplification unit 153 and the first hysteresis unit 155, and a second voltage dividing unit (not shown) may be included between the second amplification unit 154 and the second hysteresis unit 156. In order to prevent the input of the first hysteresis unit 155 from being fixed according to an output of the first amplification unit 153, a first voltage dividing unit may be included between an output terminal of the first amplification unit 153 and an input terminal of the first hysteresis unit 155. The output of the first amplification unit 153 is divided into voltages through the first voltage dividing unit and applied to the first hysteresis unit 155, thereby enabling the first hysteresis unit 155 to be operated with hysteresis characteristics.

The switching element operation detection signal output unit 157 outputs switching element operation detection signal when the output of the first hysteresis unit 155 and the output of the second hysteresis unit 156 are both high signals. The first hysteresis unit 155 outputs a high signal when an input signal corresponding to turn-on is inputted to the first switching element 130, and the second hysteresis unit 156 outputs a high signal when an input signal corresponding to turn-on is inputted to the second switching element 140. The switching element operation detection signal output unit 157 outputs a switching element operation detection signal when both the first switching element 130 and the second switching element 140 are turned on, that is, when both the first hysteresis unit 155 and the second hysteresis unit 156 output high signals.

The switching element operation detection signal output unit 157 can apply a switching element operation detection signal to the controller 160 that controls the photovoltaic power generation inverter 110 using a switching element operation detection signal. By applying switching element operation detection signal to the controller 160, the controller 160 detects that all switching elements are turned on and controls the inverter 110 to transmit photovoltaic power being generated to the grid 120.

The switching element operation detection signal output unit 157 can be implemented as an and circuit so as to output switching element operation detection signal when both the first hysteresis unit 155 and the second hysteresis unit 156 are high signals, the and circuit is called a series circuit or logical product circuit, and refers to a circuit that outputs high only when high (1) is inputted to all input terminals. The switching element operation detection signal output unit can implement an and circuit using a third switch and a fourth switch being connected in series.

A third switch operates according to an output signal of the first hysteresis unit 155, a fourth switch is connected in series with the third switch and operates according to an output signal of the second hysteresis unit 156, and the switching element operation detection signal may be outputted when the third switch and the fourth switch are turned on. The third switch is turned on when an output signal of the first hysteresis unit 155 is high, and the fourth switch is turned on when an output signal of the second hysteresis unit 156 is high. Since the third switch and the fourth switch are connected in series, a voltage is applied between both terminals other than the common terminal to which the third switch and the fourth switch are connected when both the third and fourth switches are turned on, and the corresponding voltage signal can be output as switching element operation detection signal. Here, the third switch and the fourth switch may be mosfets, and in addition, it may be a variety of devices that perform switching operations.

FIG. 3 is an implementation example of a switching element operation detection device according to an embodiment of the present invention. As shown in FIG. 3, the first switching element 130 and the second switching element 140 may be relays connected in series, and a current flows in the coil by the power source 132 when the switch of the driving circuit is turned on by each control signals 133 and 143, thereby turning the first switching element 130 and the second switching element 140 on. At this time, the current flowing in each driving circuit is sensed by the first sensing resistor rsen1 and the second sensing resistor rsen2 corresponding to the first sensing unit 151 and the second sensing unit 152. The first sensing voltage vsen1 applied to the first sensing resistor is applied to the first amplification unit 153, and the second sensing voltage vsen2 applied to the second sensing resistor is applied to the second amplification unit 154. The voltage amplified in the first amplification unit 153 is applied to the first hysteresis unit 155, and the voltage amplified in the second amplification unit 154 is applied to the second hysteresis unit 156. The first hysteresis unit 155 compares the voltage of the applied signal with a first value or a second value and outputs a high signal or a low signal. The first value is a value corresponding to the threshold at which a current sufficient to turn on the first switching element 130 flows through the coil, and the first hysteresis unit 155 outputs a high signal when the first switching element 130 is turned on. Conversely, the first hysteresis unit 155 outputs a low signal when the first switching element 130 is off. The second hysteresis unit 156 also outputs a high signal or a low signal depending on the on/off state of the second switching element 140. The first hysteresis unit 155 and the second hysteresis unit 156 apply an output signal to the switching element operation detection signal output unit 157, and the switching element operation detection signal output unit 157 applies a switching element operation detection signal to the controller 160 when the outputs of the first hysteresis unit 155 and the second hysteresis unit 156 are both high signals. The controller 160 detects that both the first switching element 130 and the second switching element 140 are turned on at the corresponding time point and may control the inverter 110 so as to transmit power to grid 120 or receive power from the grid 120.

Figure 4:
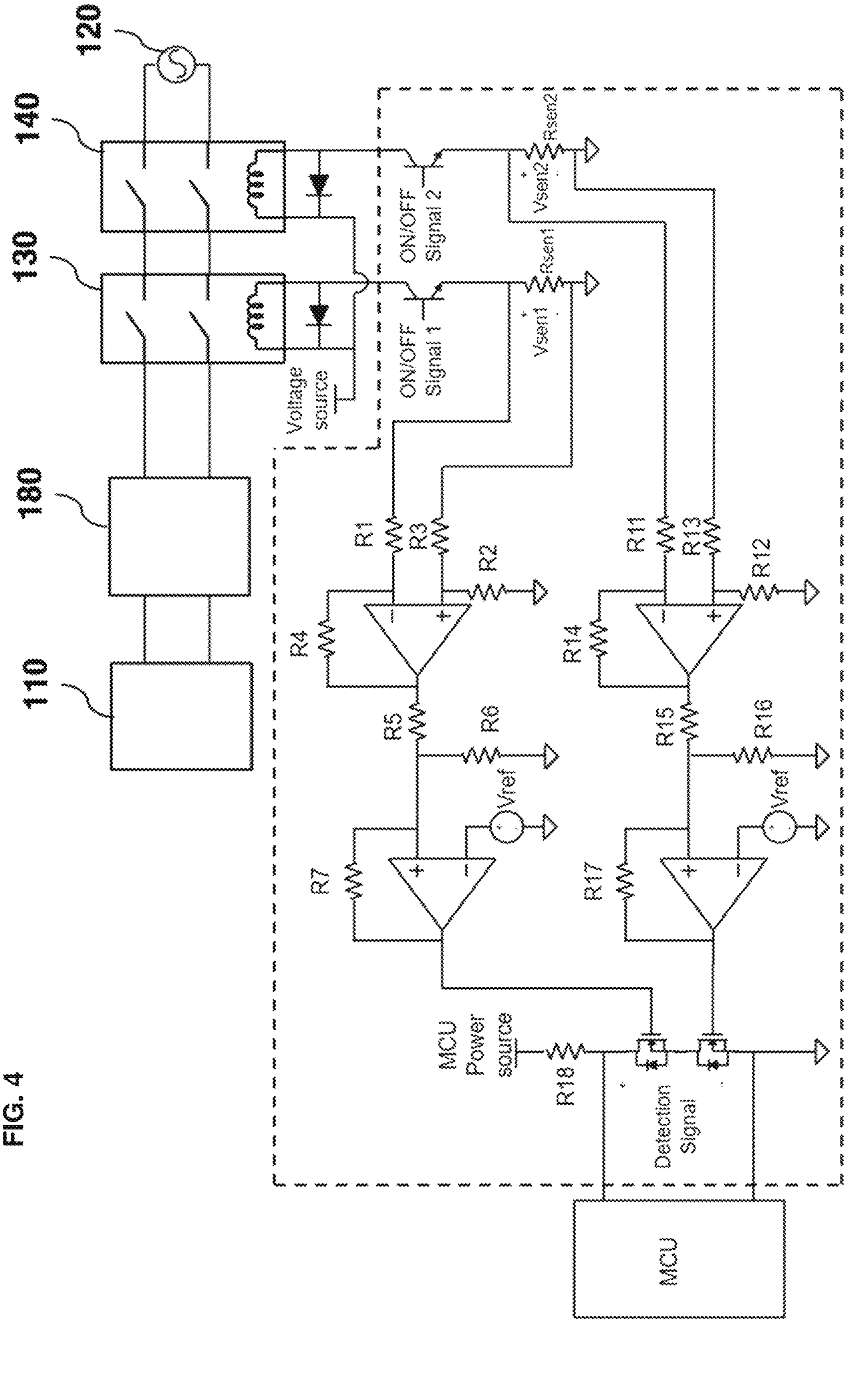

FIG. 4 illustrates a circuit implementation example of a switching element operation detection device according to an embodiment of the present invention. As shown in FIG. 4, the first amplification unit 153 and the second amplification unit 154 may be implemented as differential amplifiers. Both ends of the first sensing resistor rsen1 are connected to the input terminal of the op-amp through r1, r2, and r3, respectively, and the (−) input terminal of op-amp is connected to an output terminal through r4, thereby differentially amplifying the first sensing voltage vsen1 applied to the first sensing resistor. The second amplification unit 154 is composed of r11, r12, r13, r14, and op-amp, as shown in FIG. 4, and differentially amplifies the second sensing voltage vsen2 applied to the second sensing resistor. The voltage output from the first amplification unit 153 is divided by r5 and r6 and applied to the first hysteresis unit 155. The first hysteresis unit 155 includes op-amp, and the voltage divided by r5 and r6 is applied to the (+) input terminal. A reference voltage vref is connected to the (−) input terminal of op-amp, and the (+) input terminal is connected to the output terminal through r7 to output a high or low signal depending on the level of voltage being applied to the (+) input terminal. R5, r6, r7, op-amp, and vref may be configured as the first hysteresis unit 155.

The voltage being outputted from the second amplification unit 154 is divided by r15 and r16 and applied to the second hysteresis unit 156. The second hysteresis unit 156 may be configured with r17, op-amp, and vref, or may be configured to include r15 and r16. Op-amp of the second hysteresis unit 156 outputs a high or low signal depending on the magnitude of the voltage applied to the (+) input terminal.

The output signal of the first hysteresis unit 155 is applied to the gate of the third switch constituting the switching element operation detection signal output unit 157, and the output signal of the second hysteresis unit 156 is applied to the gate of the fourth switch constituting the switching element operation detection signal output unit 157. The third switch and the fourth switch may be connected in series and connected to the mcu power source through r18. When both the first hysteresis unit 155 and the second hysteresis unit 156 do not output high signals, at least one of the third switch or the fourth switch is open, so no current flows in r18, and a voltage corresponding to the mcu power source is applied to both ends of the switching element operation detection signal output unit being configured with the third switch and the fourth switch, and a high signal is applied to the mcu. When both the first hysteresis unit 155 and the second hysteresis unit 156 output high signals and the third and fourth switches are turned on, current flows to r18 by the mcu power source, and accordingly, the voltage applied to the third and fourth switches becomes 0 v and a low signal is applied to the mcu. The mcu may determine the low signal as switching element operation detection signal and perform operation. Or, the inverted signal of the signal according to the voltage applied to the switching element operation detection signal output unit may be judged as switching element operation detection signal and operated. The micro control unit (mcu) receives switching element operation detection signal and detects a time point when both the first switching element 130 and the second switching element 140 are turned on, and controls the inverter 110 so that power can be transmitted to the grid 120 or power can be received from the grid 120.

Figure 5:
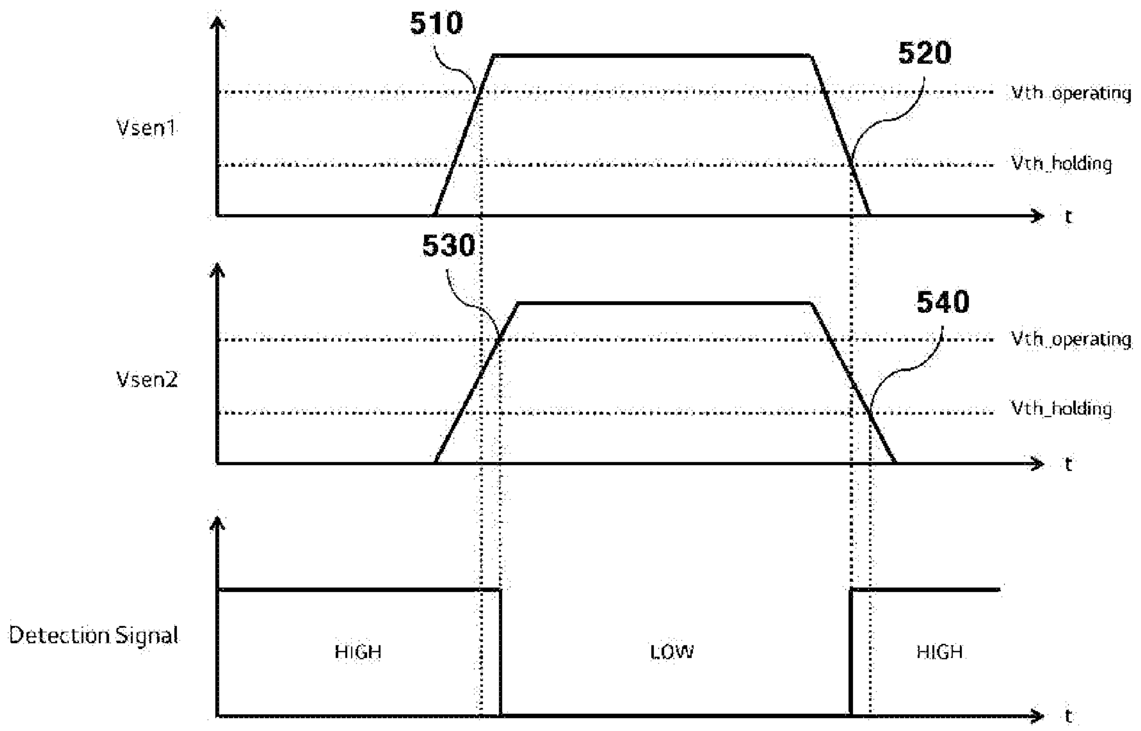

The switching element operation detection signal is determined according to the magnitude of the sensing voltage according to the current sensed by the first sensing unit 151 and the second sensing unit 152. As shown in FIG. 5, when both the first switching element 130 and the second switching element are turned off and no current flows in the driving circuit that drives each switching element, the signal being applied from the switching element operation detection signal output unit 157 to the controller 160 may be high. When receiving a high signal, the controller 160 may determine that at least one of the first switching element 130 and the second switching element is in an off state.

Afterwards, when a turn-on signal is applied to each driving circuit, the magnitude of the voltage corresponding to the current sensed by each of the sensing units 151 and 152 begins to increase. At a time point 510 when vsen1 becomes larger than the vth_operating value 510 to be determined that the first switching element 130 is operating, a high signal is outputted from the first hysteresis unit 155, but if vsen2 is smaller than the vth_operating value at that time point, a low signal is still outputted from the second hysteresis unit 156 so that the signal being applied to the controller 160 still remains high. Afterwards, when vsen2 becomes also greater than the vth_operating value, a high signal is outputted from the second hysteresis unit 156 at that time point 530, and when both of the output signals of the first hysteresis unit 155 and the second hysteresis unit 156 become high, both the third switch and fourth switch of the switching element operation detection signal output unit 157 are turned on, and the signal being applied from the switching element operation detection signal output unit 157 to the controller 160 is converted to low. The controller 160 may receive a low signal and determine that both the first switching element 130 and the second switching element 140 are turned on at the time point when a low signal is received, and afterwards, the inverter 110 can be controlled.

After the first switching element 130 and the second switching element 140 are turned on, if vsen1 or vsen2 does not become smaller than the vth_holding value, on state is maintained. That is, the turn-on voltage is greater than the turn-off voltage. After both the first switching element 130 and the second switching element 140 are determined to be turned on, if vsen1 or vsen2 is smaller than vth_holding but greater than vth_holding, in order to determine that the first switching element 130 and the second switching element 140 are in an on state, the hysteresis characteristics of the first hysteresis unit 155 and the second hysteresis unit 156 are used. That is, the first hysteresis unit 155 and the second hysteresis unit 156 can be set to output a low signal after the output signal becomes high and when vsen1 or vsen2 is smaller than vth_holding. That is, at the time point when vsen1 becomes smaller than vth_holding 520, the output of the first hysteresis unit 155 changes from a high signal to a low signal, and as a result, even before the time point 540 when vsen2 becomes smaller than vth_holding, the signal being applied from the switching element operation detection signal output unit 157 to the controller 160 is converted from low to high. That is, since the controller 160 can immediately know the time point at which at least one switching element of the first switching element 130 and the second switching element 140 is turned off, the circuit or system can be protected by immediately responding to abnormal operation of the switching element.

Figure 6:
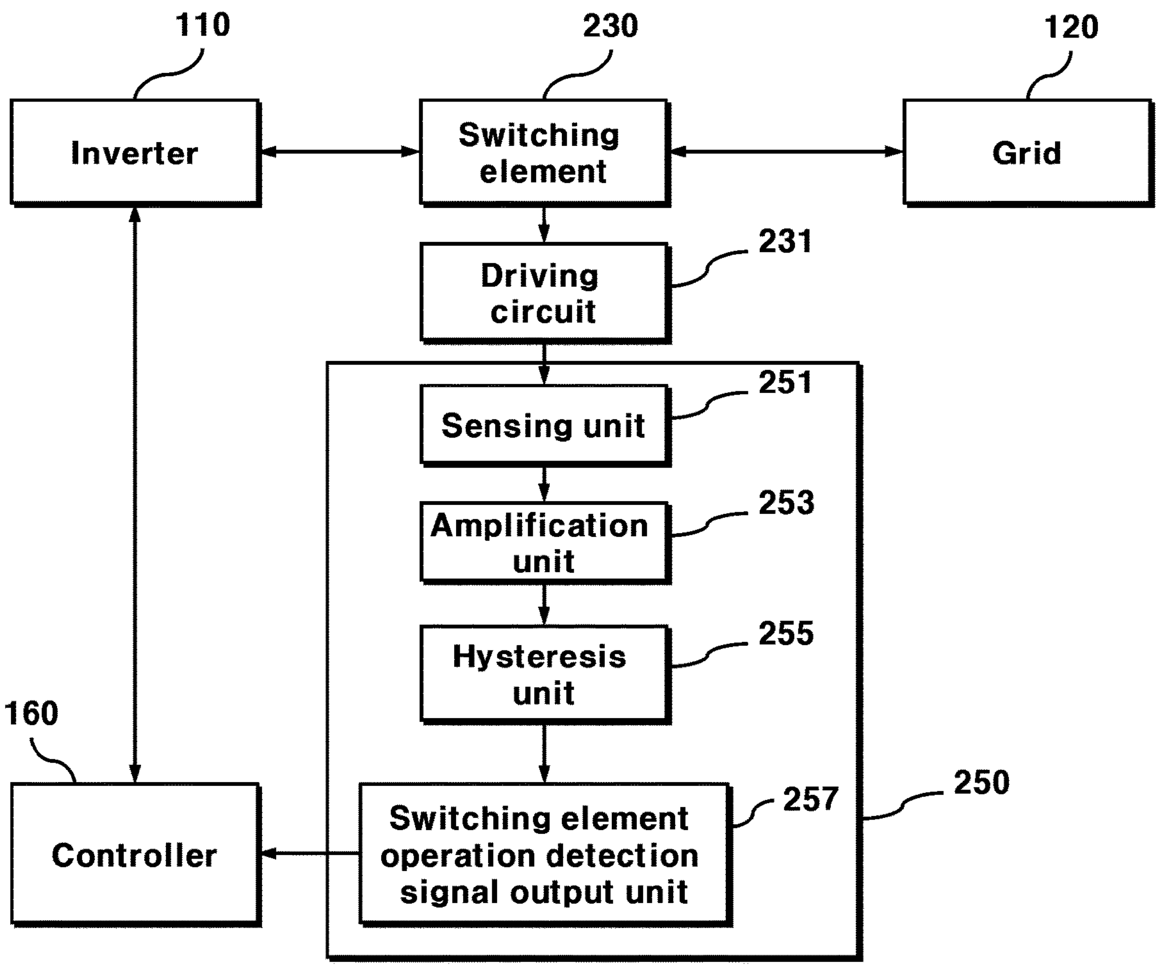
FIG. 6 is a block diagram of a switching element operation detection device according to another embodiment of the present invention.

FIG. 6 is a block diagram of a switching element operation detection device according to another embodiment of the present invention.

The switching element operation detection device 250 according to another embodiment of the present invention is configured with a sensing unit 251, an amplification unit 253, a hysteresis unit 255, and a switching element operation detection signal output unit 257. The sensing unit 251 senses the current flowing in the driving circuit 231 that drives the switching element 230, the amplification unit 253 amplifies the current sensed by the sensing unit 251, and the hysteresis unit 255 outputs a high or low signal depending on the output of the amplification unit. The hysteresis unit 255 outputs a high signal when the output signal is a low signal and if the input voltage is greater than the first value, and may output a low signal when the output signal is a high signal and if the input voltage is below the second value. Through this, hysteresis characteristics can be implemented. The switching element operation detection signal output unit 257 uses the output signal of hysteresis unit 251 to output a switching element operation detection signal.

The detailed description of each configuration of the switching element operation detection device 250 according to the embodiment of FIG. 6 corresponds to the detailed description of each configuration of the switching element operation detection device 150 of FIGS. 2 to 5. The driving circuit 231 corresponds to the driving circuit 131 or the driving circuit 141, the sensing unit 251 corresponds to the first sensing unit 151 or the second sensing unit 152, the amplification unit 253 corresponds to the first amplification unit 153 or the second amplification unit 154, and the hysteresis unit 255 may correspond to the first hysteresis unit 155 or the second hysteresis unit 156. Hereafter, overlapping explanations will be omitted.

The switching element 230 may include a plurality of switching elements, and may include a plurality of sensing units, a plurality of amplification units, and a plurality of hysteresis units in accordance with the number of switching elements, wherein one sensing unit, one amplification unit, and one hysteresis unit are sequentially connected to each of the plurality of switching elements, and wherein the switching element operation detection signal output unit 257 receives output signals from the plurality of hysteresis units, and wherein when all output signals of the plurality of hysteresis units are high, the switching operation detection signal can be outputted.

Figure 7:
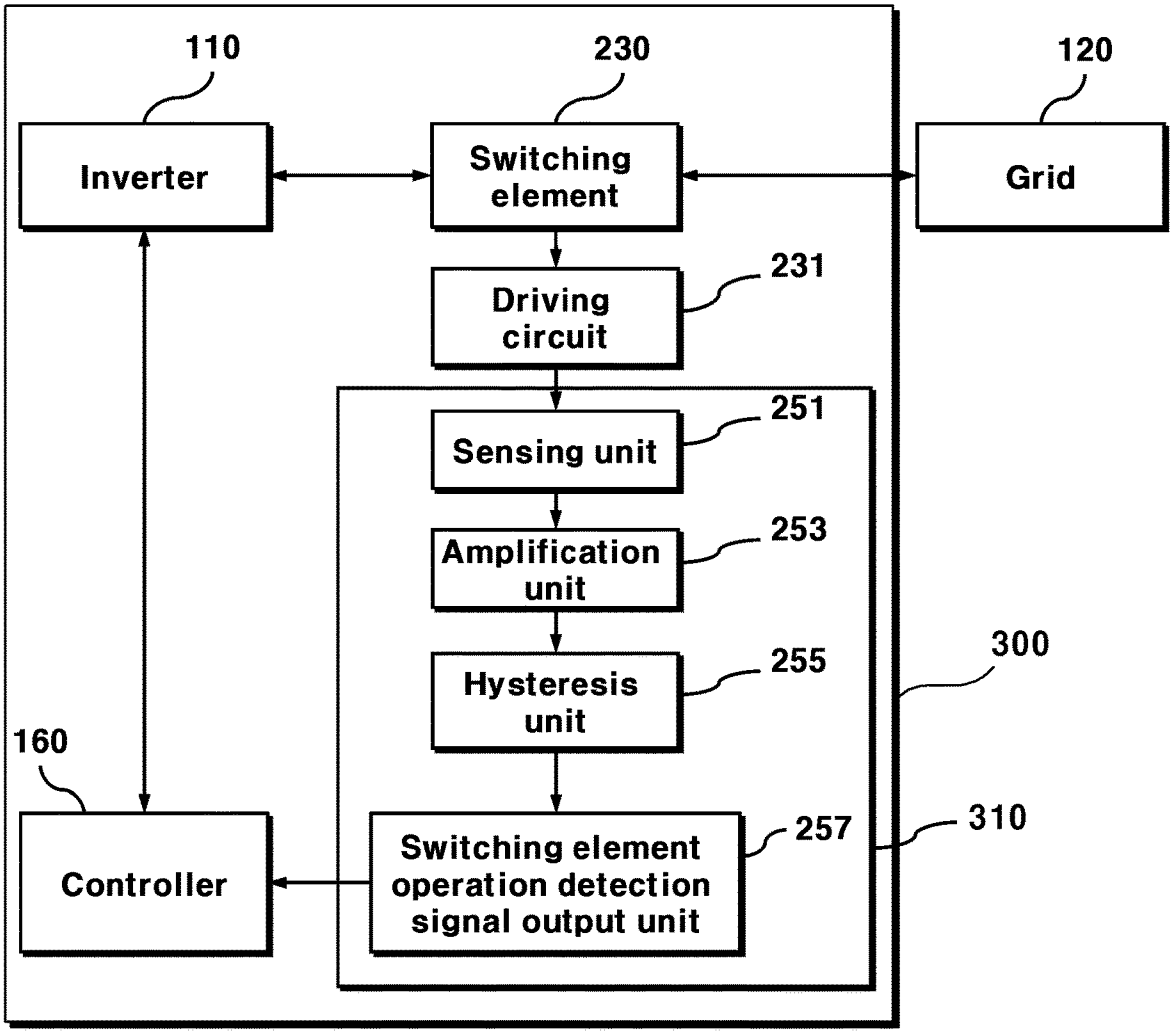
FIG. 7 is a block diagram of a photovoltaic power generation power conversion device according to an embodiment of the present invention.

FIG. 7 is a block diagram of a photovoltaic power generation power conversion device according to an embodiment of the present invention.

The photovoltaic power generation power conversion device 300 according to an embodiment of the present invention is configured with an inverter 110, a controller 160, a switching element 230, and a switching element operation time point detection unit 310. The inverter 110 converts the power generated by the photovoltaic power generation panel and transmits it to the grid, and the controller 160 controls the inverter 110. Pluralities of switching elements 230 are connected in series between the inverter and the grid, and the switching element operation time point detection unit 310 detects a time point when all of the pluralities of switching elements operate.

Since a detailed description of the configuration of the switching element operation time point detection unit 310 included in the photovoltaic power generation power conversion device 300 according to the embodiment of FIG. 7 corresponds to the detailed description of each configuration of the switching element operation detection device 150 in FIGS. 2 to 6, overlapping descriptions will be omitted.

The switching element operation time point detection unit 310 configured with a sensing unit 251, an amplification unit 253, a hysteresis unit 255, and a switching element operation detection signal output unit 257. The sensing unit 251 senses the current flowing in the driving circuit 231 that drives the switching element 230, the amplification unit 253 amplifies the current sensed by sensing unit 251, and the hysteresis unit 255 outputs a high or low signal depending on the output of the amplification unit. The hysteresis unit 255 outputs a high signal when the output signal is a low signal and if the input voltage is greater than the first value, and may output a low signal when the output signal is a high signal and if the input voltage is equal to or less than the second value. Through this, hysteresis characteristics can be implemented. The switching element operation detection signal output unit 257 applies a switching element operation detection signal to the controller 160 at the time point when the output signals of the hysteresis unit 255 corresponding to each of the pluralities of switching elements 230 are all high signals. The controller 160 controls the inverter 110 according to the applied time point of the switching element operation detection signal.

Those skilled in the art related to the present embodiment will be able to understand that it may be implemented in a modified form within a range that does not deviate from the essential characteristics of the above description. Therefore, the disclosed methods should be considered from an explanatory point of view, not from a limited point of view. The scope of the present invention is shown in the claims rather than the foregoing description, and all differences within the equivalent scope will be construed as being included in the present invention.

The invention claimed is:

1. A switching element operation detection device comprising:
- a first sensing unit configured to sense a current flowing in a driving circuit that drives the first switching element;
- a second sensing unit configured to sense the current flowing in the driving circuit that drives the second switching element;
- a first amplification unit configured to amplify the current sensed by the first sensing unit;
- a second amplification unit configured to amplify the current sensed by the second sensing unit;
- a first hysteresis unit configured to output a high signal or a low signal according to output of the first amplification unit;
- a second hysteresis unit configured to output a high signal or a low signal according to output of the second amplification unit; and
- a switching element operation detection signal output unit configured to output switching element operation detection signal when both outputs of the first hysteresis unit and output of the second hysteresis unit are high signals.

2. The switching element operation detection device according to claim 1,
- wherein the first switching element and the second switching element are connected in series.

3. The switching element operation detection device according to claim 1,
- wherein the first switching element and the second switching element are disposed between a photovoltaic power generation inverter and a grid.

4. The switching element operation detection device according to claim 3,
- wherein the switching element operation detection signal output unit applies the switching element operation detection signal to a controller that controls the photovoltaic power generation inverter using the switching element operation detection signal.

5. The switching element operation detection device according to claim 1,
- wherein the first switching element and the second switching element are relays connected in series.

6. The switching element operation detection device according to claim 1,
- wherein the driving circuit configured to drive the first switching element comprises:
- a first switch turned on and off according to a first switching element control signal, and
- wherein the first sensing unit senses a current flowing in the driving circuit that drives the first switching element when the first switch is turned on.

7. The switching element operation detection device according to claim 1 comprising:
- a first voltage divider configured to input output of the first amplification unit to the first hysteresis unit by voltage dividing; and
- a second voltage divider configured to input output of the second amplification unit to the second hysteresis unit by voltage dividing.

8. The switching element operation detection device according to claim 1,
- wherein the first sensing unit comprises a first sensing resistor, and
- wherein the first amplification unit is a differential amplifier that receives and amplifies a voltage between both ends of the first sensing resistor.

9. The switching element operation detection device according to claim 1,
- wherein the first hysteresis unit outputs a high signal if input voltage is above a first value when output signal is a low signal, and outputs a low signal if input voltage is equal to or less than a second value when output signal is a high signal.

10. The switching element operation detection device according to claim 9,
- wherein the first value is greater than a second value.

11. The switching element operation detection device according to claim 1,
- wherein the switching element operation detection signal output unit comprises:
- a third switch operating according to output signal of the first hysteresis unit; and
- a fourth switch connected in series with the third switch and operating according to output signal of the second hysteresis unit, and
- wherein the switching element operation detection signal is outputted when the third switch and the fourth switch are turned on.

12. A switching element operation detection device comprising:
- a sensing unit configured to sense a current, wherein the current is flowing in a driving circuit that drives a switching element;

an amplification unit configured to amplify the current sensed by the sensing unit;

a hysteresis unit configured to output a high or low signal according to output of the amplification unit; and a switching element operation detection signal output unit configured to output a switching element operation detection signal using output signal of the hysteresis unit, wherein the switching element comprises a plurality of switching elements, wherein a plurality of sensing units, a plurality of amplification units, and a plurality of hysteresis units are comprised corresponding to the number of the plurality of switching elements, wherein one of the plurality of sensing units, one of the plurality of amplification unit, and one of the plurality of hysteresis unit are sequentially connected to each of the plurality of switching elements; and wherein the switching element operation detection signal output unit receives output signals from the plurality of hysteresis units, and outputs the switching operation detection signal when the output signals of the plurality of hysteresis units are all high.

13. The switching element operation detection device according to claim 12, wherein the hysteresis unit outputs a high signal if input voltage is above a first value when output signal is a low signal, and outputs a low signal if input voltage is equal to or less than a second value when output signal is a high signal.

14. A photovoltaic power generation power conversion device comprising:

an inverter configured to convert power generated in a photovoltaic power generation panel and transmits it to a grid;

a controller configured to control the inverter;

a plurality of switching elements connected in series between the inverter and the grid; and a switching element operation time point detection unit configured to detect a time point of all of the plurality of switching elements operating, wherein the switching element operation time point detection unit comprises:

a sensing unit configured to sense current flowing in a driving circuit that drives the plurality of switching elements;

an amplification unit configured to amplify the current sensed by the sensing unit;

a hysteresis unit configured to output a high or low signal according to output of the amplification unit; and a switching element operation detection signal output unit configured to apply a switching element operation detection signal to the controller at a time point when all output signals of the hysteresis unit corresponding to each of the plurality of switching elements become high signals, and wherein the controller controls the inverter according to an application time point of the switching element operation detection signal.

15. The photovoltaic power generation power conversion device according to claim 14, wherein plurality of switching elements comprises a first switching element and a second switching element, wherein the sensing unit comprise a first sensing unit configured to sense a current flowing in the driving circuit that drives the first switching element; and a second sensing unit configured to sense the current flowing in the driving circuit that drives the second switching element, wherein the amplification unit comprises a first amplification unit configured to amplify the current sensed by the first sensing unit; and a second amplification unit configured to amplify the current sensed by the second sensing unit, wherein the hysteresis unit comprises a first hysteresis unit configured to output a high signal or a low signal according to output of the first amplification unit; and a second hysteresis unit configured to output a high signal or a low signal according to output of the second amplification unit.

16. The photovoltaic power generation power conversion device according to claim 15, wherein the driving circuit configured to drive the first switching element comprises:

a first switch turned on and off according to a first switching element control signal, and wherein the first sensing unit senses a current flowing in the driving circuit that drives the first switching element when the first switch is turned on.

17. The photovoltaic power generation power conversion device according to claim 15 comprising:

a first voltage divider configured to input output of the first amplification unit to the first hysteresis unit by voltage dividing; and a second voltage divider configured to input output of the second amplification unit to the second hysteresis unit by voltage dividing.

18. The photovoltaic power generation power conversion device according to claim 15, wherein the first sensing unit comprises a first sensing resistor, and wherein the first amplification unit is a differential amplifier that receives and amplifies a voltage between both ends of the first sensing resistor.

19. The photovoltaic power generation power conversion device according to claim 15, wherein the first hysteresis unit outputs a high signal if input voltage is above a first value when output signal is a low signal, and outputs a low signal if input voltage is equal to or less than a second value when output signal is a high signal.

* * * * *